United States Patent
Seth et al.

(10) Patent No.: US 7,830,183 B2
(45) Date of Patent: Nov. 9, 2010

(54) COMPARATOR WITH REDUCED POWER CONSUMPTION

(75) Inventors: Sumantra Seth, Bangalore (IN); Abhijith Arakali, Mysore (IN)

(73) Assignee: Texas Instruments Incorporated, Dallas, TX (US)

( * ) Notice: Subject to any disclaimer, the term of this patent is extended or adjusted under 35 U.S.C. 154(b) by 57 days.

(21) Appl. No.: 12/333,299

(22) Filed: Dec. 11, 2008

(65) Prior Publication Data

US 2010/0148854 A1    Jun. 17, 2010

(51) Int. Cl.
    *H03B 1/00*    (2006.01)
(52) U.S. Cl. .......................................... 327/112; 327/80
(58) Field of Classification Search ............... 327/77, 327/80, 81, 85, 108, 109, 112
    See application file for complete search history.

(56) References Cited

U.S. PATENT DOCUMENTS

| | | | | |
|---|---|---|---|---|
| 5,457,414 A | * | 10/1995 | Inglis et al. | 327/77 |
| 6,020,768 A | * | 2/2000 | Lim | 327/77 |
| 6,624,672 B2 | * | 9/2003 | Confaloneri et al. | 327/112 |
| 7,683,671 B2 | * | 3/2010 | Lee | 326/83 |

OTHER PUBLICATIONS

Meng-Tong Tan, Joseph S. Chang and Yit-Chow Tong, "A Process-Independent Threshold Voltage Invertercomparator for Pulse Width Modulation Applications", School of Electrical and Electronic Engineering Nanyang Technological University Singapore 639798, IEEE, Year 1999, p. 1201-1204.

On-The-Go Supplement to the USB 2.0 Specification, Revision 1.0a, USB Implementers Forum, INC.Year Jun. 24, 2003 pp. 1-77.

"A Process-Independent Threshold Voltage Inverter-Comparator for Pulse Width Modulation Applications," The Sixth IEEE International Conference on Electronics, Circuits and Systems, vol. 3, Sep. 5-8, 1999, pp. 1201-1204 (Meng-Tong Tan, Joseph S. Chang and Yit-Chow Tong).

* cited by examiner

*Primary Examiner*—Jeffrey S Zweizig
(74) *Attorney, Agent, or Firm*—John J. Patti; Wade J. Brady, III; Frederick J. Telecky, Jr.

(57) ABSTRACT

A comparator component having a comparison circuit and bias generator circuit, with the bias generator circuit also having a same number of transistors connected in an identical configuration, as those contained in the comparison circuit to generate a comparison result based on the bias signal generated by the bias generator circuit. A transistor of the comparison circuit receiving the bias signal is connected to a corresponding transistor in the bias generator circuit, in a current mirror configuration. The same bias circuit may be shared by many comparison circuits of corresponding comparator components. The features can be extended to provide hysteresis.

13 Claims, 4 Drawing Sheets

COMPARATOR WITH REDUCED POWER CONSUMPTION

BACKGROUND OF THE INVENTION

1. Technical Field

The present disclosure relates generally to comparators, and more specifically to a comparator with reduced power consumption.

2. Related Art

A comparator is a component, which compares the magnitudes of a pair of signals, and provides one output level if a first one of the pair is greater than the second, and another output otherwise. The signals may represent electrical parameters such as currents or voltages provided as inputs to the comparator. Alternatively, only one signal may be provided as an (external) input, while the other may be a current or voltage level generated within the comparator. Examples of such alternative comparators are logic inverter circuits, inverting and non-inverting buffers etc.

Comparators often need to be implemented to meet several requirements, such as reduced power consumption and higher switching speeds. Further, it may be desirable that the switching threshold(s) (the specific voltage or current level at which the output of the comparator changes state) be substantially immune to variations in manufacturing process, and operating temperature.

Several aspects of the present invention provide for comparators meeting one or more of such objectives, as described below with examples.

SUMMARY

According to an aspect of the present invention, a comparator component contains a comparison circuit and bias generator circuit, with the bias generator circuit also having a same number of transistors connected in an identical configuration, as those contained in the comparison circuit to generate a comparison result based on the bias signal generated by the bias generator circuit. A transistor of the comparison circuit receiving the bias signal is connected to a corresponding transistor in the bias generator circuit, in a current mirror configuration.

The same bias circuit may be shared by many comparison circuits of corresponding comparator components. The features can be extended to provide hysteresis.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

BRIEF DESCRIPTION OF THE DRAWINGS

Example embodiments of the present invention will be described with reference to the accompanying drawings briefly described below.

In the drawings, like reference numbers generally indicate identical, functionally similar, and/or structurally similar elements. The drawing in which an element first appears is indicated by the leftmost digit(s) in the corresponding reference number.

DESCRIPTION OF EXAMPLE EMBODIMENTS

1. Example Environment

Figure 1A:
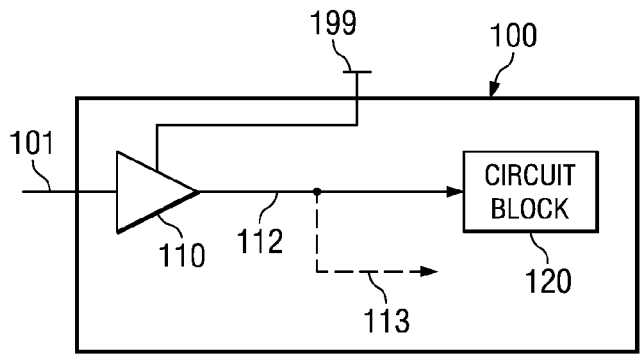
FIG. 1A is a block diagram of an example environment in which several aspects of the present invention can be implemented.

FIG. 1A is a block diagram illustrating an example component in which several aspects of the present invention can be implemented. The example of FIG. 1A is provided merely by way of illustration, and several aspects of the present invention can be implemented in other components and/or environments as well. Integrated Circuit (IC) 100 is shown containing comparator 110 and circuit block 120. Comparator 110 may receive an input signal on path 101, compare the strength (magnitude) of input 101 with an internal threshold (or reference) level, and provide a digital output on path 112 as a comparison result of input 101 against the internal threshold. Output 112 may be provided as input to other blocks in IC 100, such as to circuit block 120, and to other blocks (not shown) via path 113. Terminal 199 represents a power supply terminal.

Figure 1B:
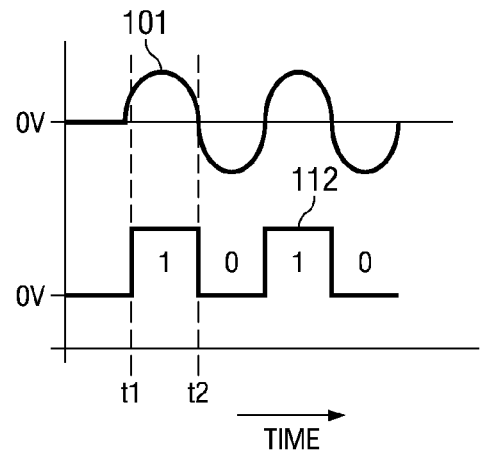
FIG. 1B is a timing diagram depicting input and output waveforms of a comparator in an example scenario.

FIG. 1B shows example input and output signals of comparator 110 of FIG. 1A. In the example of FIG. 1B, it assumed that comparator 110 receives a sine wave 101, with an average (DC) level of 0 volts. Assuming, the internal comparison threshold of comparator 110 is zero volts, output 112 will be a pulse train, having a logic level 1, when input 101 is greater than 0V, and a logic level 0 when input 101 is less than 0V. Time instances t1 and t2 represent switching time instances at which output 112 of comparator 120 changes state.

Several features of the present invention enable comparator 110 to be implemented with desirable features such as, for example, stable switching threshold(s), low-power consumption, fast switching speeds, etc, and are described below with respect to example embodiments.

2. Improved Comparator

Figure 2:
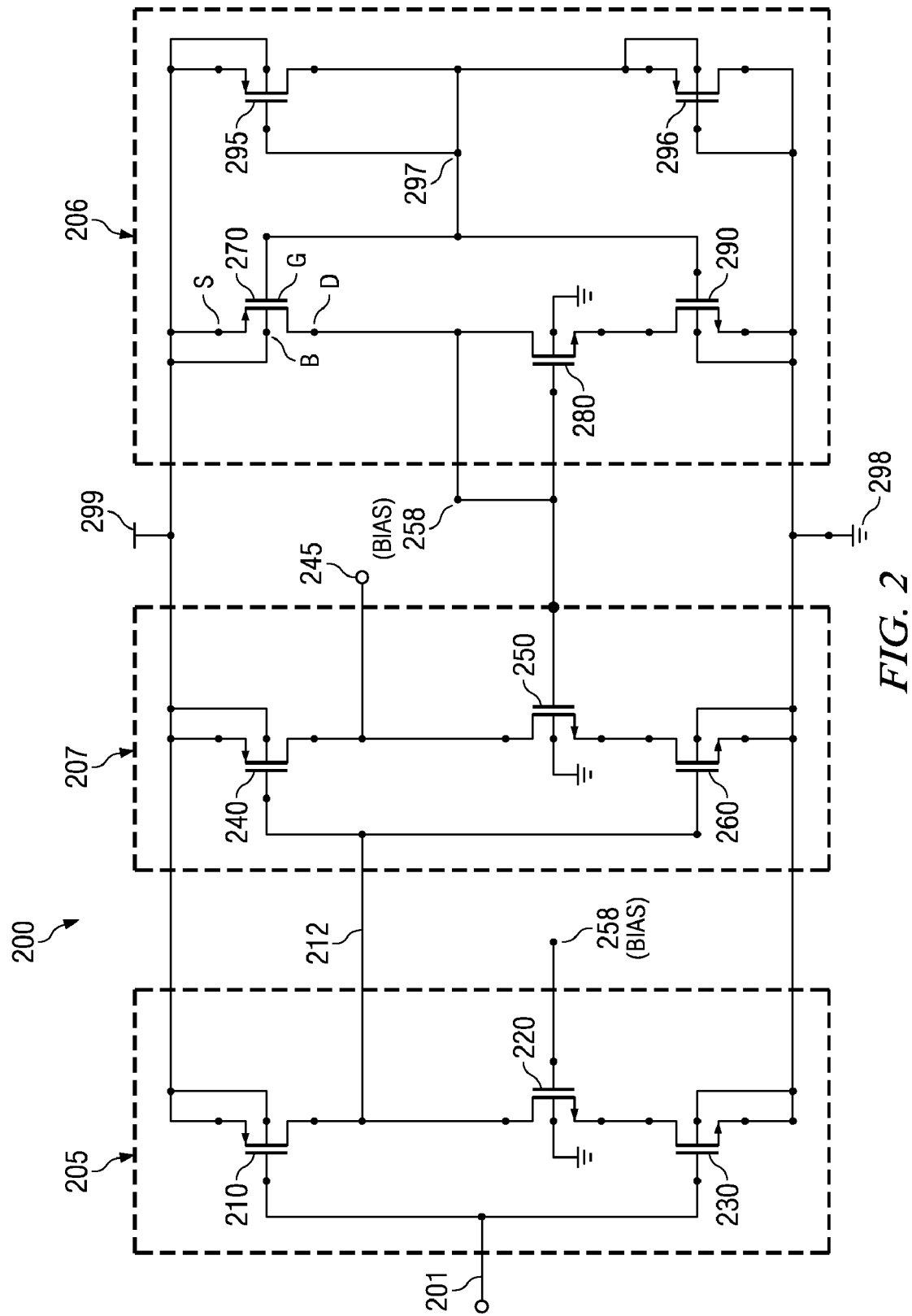
FIG. 2 is a circuit diagram illustrating the implementation details of a comparator in an embodiment of the present invention.

FIG. 2 is a circuit diagram of a comparator in an embodiment of the present invention. Comparator component 200 is shown containing comparison circuit (205), bias generator (206), and inverter block 207. The gate, source, drain and bulk terminals of transistor 270 are denoted respectively by symbols G, S, D and B. Corresponding terminals of the other transistors are denoted with the same convention. The bulk (substrate) terminal of each of the PMOS transistors is shown connected to power supply (Vdd) 299. The bulk (substrate) terminal of each of the NMOS transistors is shown connected to ground (298). The bulk terminal of PMOS 296 is connected to its source terminal.

Bias generator 206 operates to generate a (stable) switching threshold for comparison circuit 205 as well as inverter block 207, and is shown containing transistors PMOS 270, 296 and 295, and NMOS 280 and 290. The connections of transistors 295 and 296 cause a voltage equal to half the supply voltage 299 (Vdd/2) to be provided on node 297. Transistors 295 and 296 are implemented to have large sizes (and hence large channel resistances, when ON), thereby minimizing current flowing from Vdd (299) to ground (298) through transistors 295 and 296. Voltage Vdd/2 at node 297 is provided to the gate terminals of each of transistors 270 and 290. Alternatively, resistors can be also used for voltage division instead of transistors 295 and 296.

The provision of voltage Vdd/2 to the gate terminals of transistors 270 and 290 switches both these transistors on. The drain terminal of transistor 280 is connected to its gate terminal, and transistor 280 is also on. The voltage (258) at the gate terminal of transistor 280 is provided as bias voltage to respective gate terminals of transistors 220 and 250, contained respectively in comparison circuit 205 and inverter block 207.

Comparison circuit 205, shown containing PMOS 210 and NMOS 220 and 230, receives an input signal on path 201. Signal 201 is provided to the gate terminals of transistors 210 and 230. Sizes of transistors 210, 220 and 230 are respectively made substantially equal to (or scaled by a factor to) the sizes of (and have the same characteristics as) transistors 270, 280 and 290. Since the gate terminal of transistor 220 is connected to the same bias voltage (258) as the gate terminal of transistor 280, transistors 220 and 280 operate as a current mirror pair. As is well known, a current mirror configuration (in which the pair operates) implies that a current set to be passed in one transistor of a pair, causes a same current to flow through the other transistor of the pair.

Therefore, during operation, current flowing through transistor 220 equals current flowing through transistor 280. Since the voltage at terminal 258 is set by a voltage equal to Vdd/2 on the gate terminals of transistors 270 and 290, the switching threshold of comparison circuit 205 is also equal to Vdd/2. Thus, output 212 of comparison circuit 205 changes logic levels whenever input 201 crosses the threshold voltage of Vdd/2. Specifically, output 212 changes to (and remains at) logic 0 when input 201 rises above voltage level Vdd/2. Output 212 changes to (and remains at) logic 1 when input 201 falls below voltage level Vdd/2.

As noted above, transistors 295 and 296 are fabricated to be substantially equal in size, and thus variations in their characteristics (for example, ON resistance) due to variations in manufacturing process and/or temperature are substantially equal. Hence, the switching threshold of comparison circuit 205 is maintained equal to voltage Vdd/2 across process and temperature variations. In alternative embodiments, when a threshold voltage (at node 297) different from Vdd/2 is desired, the sizes of transistors 295 and 296 may be implemented to have a corresponding ratio in terms of size, to enable provision of the desired threshold voltage.

Further, it may be observed that comparison circuit 205 consumes power (current flows through transistors 210, 220 and 230) only when voltage level excursions on input 201 cause output 212 switch logic states.

Inverter block 207 operates similar to comparison circuit 205, and is shown containing PMOS 240 and NMOS 250 and 260. Since the gate terminal of transistor 250 is connected to the same bias voltage (258) as the gate terminal of transistor 280, transistors 250 and 280 also operate as a current mirror pair. Inverter block 207 receives as input the logic level on output 212, and provides a logic output 245 that is the inverse of the logic level on output 212.

Comparison circuit 205 and inverter block 207 may be viewed as "stages" of comparison component 200. It may be observed that the interconnections between transistors 210, 220 and 230 is identical to those between transistors 270, 280 and 290 (except for the self-bias connection (drain to gate) of transistor 280, which is provided for current mirroring), and the respective transistor sets may be viewed as being connected according to a same "configuration". It is noted that transistors 240, 250 and 260 are also interconnected according to the same configuration. Further, transistors 220, 280 and 250 contained respectively in comparison circuit 205, bias generator 206 and inverter block 207 are contained in a same "position" (middle position) in the respective blocks.

In an embodiment of the present invention, sizes of transistors 240, 250 and 260 are respectively made substantially equal to the sizes of (and have the same ON resistance, etc., characteristics as) transistors 270, 280 and 290. Hence, as noted above with respect to comparison circuit 205, the switching threshold of inverter block 207 is also maintained at voltage Vdd/2 despite variations in manufacturing process and operating temperature variations.

From the description above, it may be appreciated that the approach of FIG. 2 provides a comparison circuit (comparator) with reduced current consumption (consumes zero static current (ignoring bias current consumption), and has a switching threshold that is substantially independent of process and temperature variations. Comparison circuit 205 consumes current only when input 201 crosses (transitions through) switching threshold voltage Vdd/2. The only static current (current when no logic level transitions are occurring) in the circuit of FIG. 2, is the current through transistors 270, 280 and 290. The controlled (constant across process and temperature variations) threshold voltage reduces output jitter. Current through transistor 295, 296 can be reduced to a very low value by sizing the transistors accordingly.

However, the static current consumption occurs in bias generator 206, and not in either of comparison circuit 205 or inverter 207. Typically, an integrated circuit (IC) may contain only a single bias generator (similar to bias generator 206), and several (typically hundreds or thousands) of components/comparators similar to comparison circuit 205 and inverter block 207 for each of the corresponding comparators.

Therefore, the overall current consumption is still maintained low when several instances of comparison circuits 205 and/or inverter 207 are used in an IC. The approach of FIG. 2 also enables comparison circuit 205 to have fast switching speeds. Thus, as described below, the approach of FIG. 2 provides (in addition to the above-noted advantages) a high speed comparator.

The sizes of transistors 230, 260 and 290 are implemented such that the transistors operate in the linear region of their operation when input 201 has a magnitude equal to (or close to) the switching threshold (Vdd/2). Implementation of transistor 290 to operate in the linear region ensures that the current through transistor 280 is determined by transistor 270 (which is implemented to operate in a saturation region (as noted below), and not by transistor 290, which is implemented to operate in the linear region. Since transistor 290 is sized such that it operates in the linear region, the voltage at node 258 (BIAS) is given by the following equation:

$$V258 = Vt280 + Vgs280 \qquad \text{Equation 1}$$

Wherein,

V258 is the voltage at node 258,

Vt280 is the threshold voltage of transistor 280, and

Vgs280 is the overdrive voltage (gate-to-source voltage minus threshold voltage) of transistor 280.

If V258 (as given by equation 1) is less than or equal to the sum of the voltage at node 297 (Vdd/2) and the threshold voltage of transistor 270, then transistor 270 will operate in the saturation region. When the voltage at input 201 equals Vdd/2, the voltage at node 212 equals the voltage at node 258 (BIAS), since transistors 210, 220 and 230 are substantially identical (size, characteristics) respectively to transistors 270, 280 and 290. Consequently, transistors 210 and 220 would be operating in the active (saturation) region, and the DC gain of comparison circuit 205 is provided by the following equation:

$$Dc\ gain = gm210/[gds210+gds220] \qquad \text{Equation 2}$$

wherein, gm210 is the transconductance of transistor 210, gds210 is the output conductance of transistor 210, and gds220 is the output conductance of transistor 220.

The value of gm210 is typically very large, and may be realized by sizing and current through the transistor 210. The values of gds210 and gds220 are typically very low. Hence, as may be observed from equation 2, DC gain of comparison circuit 205 is high. Consequently, the current drive during transitions between logic states at nodes 212 and 245 is high, and therefore the switching speed of comparison circuit 205 (and inverter block 207) is high. Further, a higher D.C gain ensures that even a small input (201) signal swing produces a large swing at output 212. Therefore, comparison circuit 205 toggles (switches state) very close to the threshold voltage generated by bias generator 206.

As is well known, to provide noise immunity, it may desirable to provided hysteresis in a comparator, i.e., cause the output of a comparator to switch based on different threshold levels, one for a rising input transition, and another for a falling input transition. Further, it may be desirable to provide such hysteresis such that the rising and falling transition thresholds are substantially invariant across process and temperature variations. Accordingly, the description is continued with respect to an embodiment of a comparator that provides hysteresis.

3. Hysteresis

Figure 3:
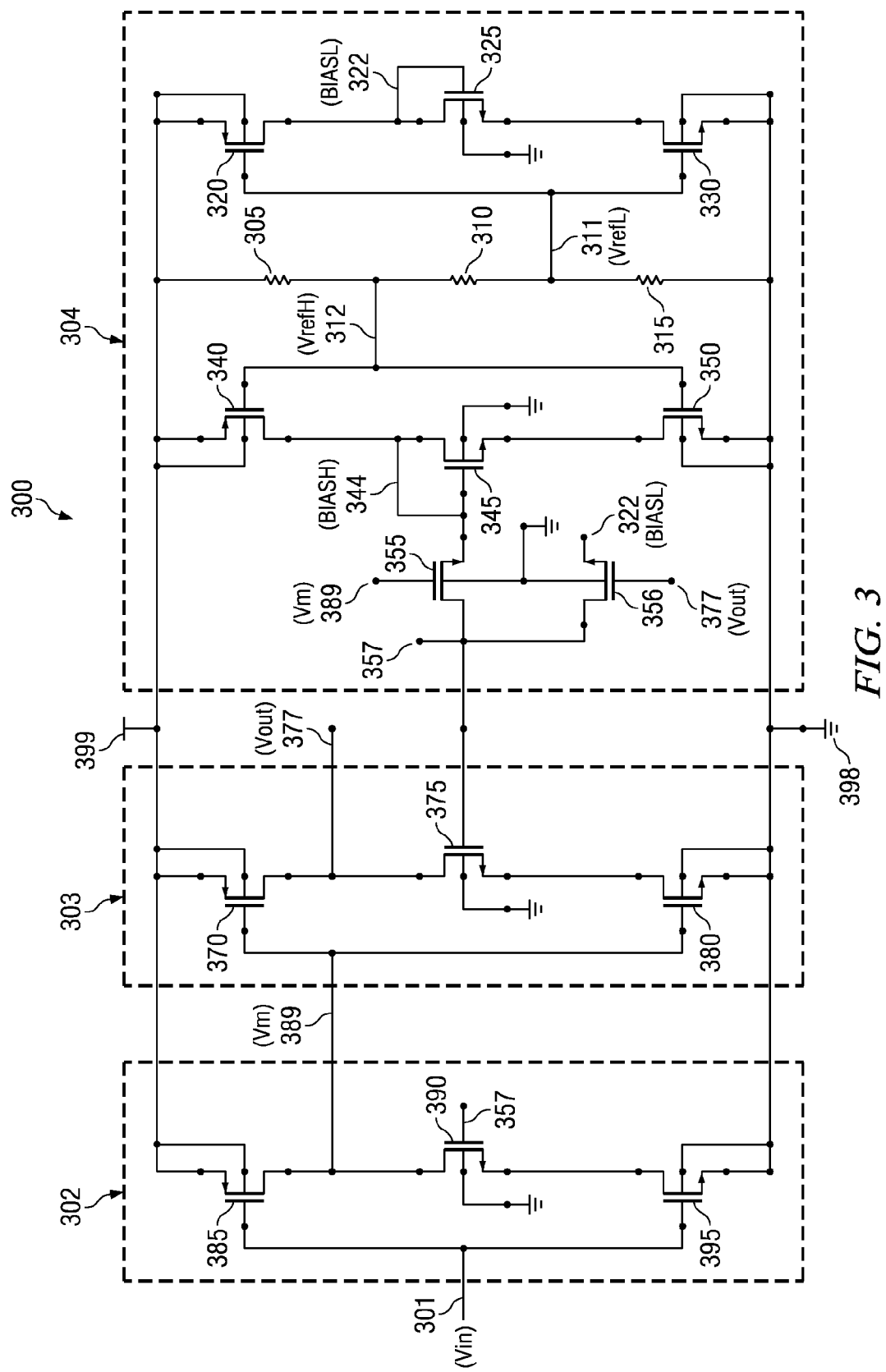
FIG. 3 is a circuit diagram illustrating the implementation details of a comparator with hysteresis, in an embodiment of the present invention.

FIG. 3 is a circuit diagram of a comparator that provides hysteresis, in an embodiment of the present invention. Comparator component 300 is shown containing comparison circuit 302, bias generator 304, and inverter block 303. The bulk (substrate) terminal of each of the NMOS transistors is connected to ground (398), and the bulk terminals of each of the PMOS transistors is connected to power supply terminal 399. Comparison circuit 302 is shown containing transistors 385, 390 and 395. Inverter block 303 is shown containing transistors 370, 375 and 380. Transistors 385, 390 and 395 are respectively substantially identical to transistors 370, 375 and 380, as well as to transistors 340, 345 and 350. Terminals 399 and 398 represent power supply and ground terminals respectively.

Bias generator 304 is shown containing resistors 305, 310 and 315, and transistors 320, 325, 330, 340, 345, 350, 355 and 356. The values of resistors 305, 310 and 315 are selected to provide reference voltages VrefH (312) and VrefL (311) that respectively set the high and low switching voltages required for providing hysteresis. Upper (higher) threshold VrefH (312) is provided to the gate terminals of transistors 340 and 350, and causes the generation of a bias voltage at node 344 (BIASH). Lower threshold voltage VrefL (311) is provided to the gate terminals of transistors 320 and 330, and causes the generation of a bias voltage at node 322 (BIASL).

The manner in which bias voltages at nodes 344 and 322 are generated is similar to that described with respect to generation of bias voltage 258 (BIAS) of FIG. 2, and the description is not repeated here in the interest of conciseness. It is merely noted here that the combination of transistors 320, 325, and 330, as well as the combination of transistors 340, 345 and 350 are similar (or substantially identical) to the combination of transistors 270, 280 and 290 of FIG. 2.

Since nodes 377 (Vout) and 389 (Vm) are respectively connected to the gate terminals of NMOS transistors 356 and 355, bias node 357 connects to node 344 (BIASH), when output 389 (Vm) of comparison circuit 302 is at logic high, and to node 322 (BIASL) when output 377 (Vout) of inverter block 303 is at logic high. It is noted that the logic level at node 389 (Vm) is the inverse of the logic level at node 377 (Vout). Node 357 is connected to the gate terminals of transistors 390 and 375.

In operation, assuming that input 301 (Vin) initially has a magnitude below VrefL (311), Vm is at logic high (logic 1), and Vout is at logic 0. As a result, bias node 357 is connected to bias voltage 344 (BIASH). As Vin (301) increases in magnitude, and reaches a voltage equal to VrefH (312), node Vm (389) switches to logic low (logic 0), and Vout (377) switches to logic 1. Vm being at logic 0 switches off transistor 355. Vout at logic 1 switches on transistor 356. As a result bias node 357 is connected to BIASL (322).

Figure 4:
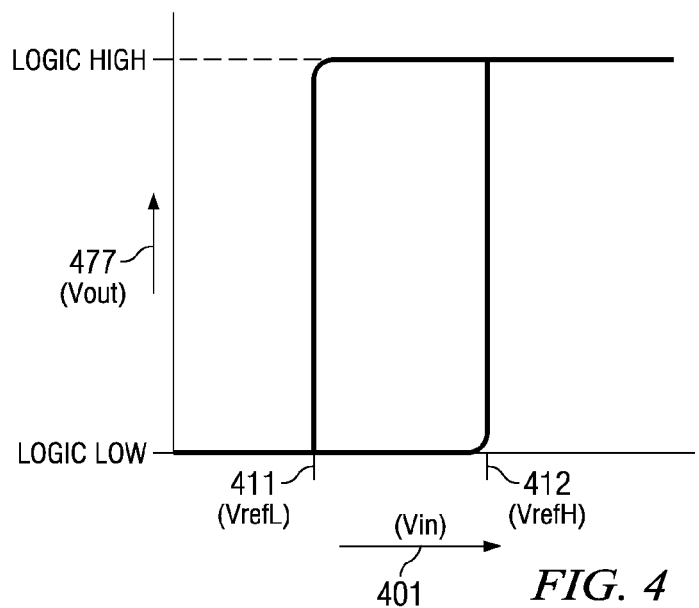
FIG. 4 is a diagram showing the input-output relationship of a comparator with hysteresis, in an embodiment of the present invention.

Therefore, once input 301 rises above VrefH (312), input 301 must fall to a magnitude equal to or less than VrefL (311) for node Vm to switch to logic 1, and node Vout to logic 0, thereby providing the desired hysteresis (equal to the difference between VrefH and VrefL). FIG. 4 illustrates graphically the hysteresis provided by the circuit of FIG. 3. In an embodiment of the present invention, a hysteresis of 50 mV (millivolts) is provided. The degree or amount of hysteresis can be varied by appropriately selecting the values of resistors 305, 310 and 315.

It may be appreciated that for reasons similar to those provided with respect to the circuit of FIG. 2, the hysteresis provided by the circuit of FIG. 3 is also substantially controlled and invariant with respect to process and temperature variations. Further, the circuit of FIG. 3 provides the advantages of low static power consumption and high switching speeds as well, for reasons similar to those noted above with respect to FIG. 2.

As noted above, in typical integrated circuit (IC) implementations, a single (or a small number of) bias generators may be provided to bias a large number of comparison circuits and/or inverter blocks. At least when fabricated using some manufacturing technologies such as UDSM (ultra-deep sub-micron) technologies, small gate oxide thickness used in such technologies may cause gate leakage current in the transistors (e.g., 220 and 250 of FIG. 2) receiving the bias voltage (e.g., BIAS 258 of FIG. 2) generated by the bias generator to be unacceptably large, and may consequently alter the bias voltage. A change in the bias voltage may alter the switching threshold. An embodiment of the present invention overcomes such a problem, as described next.

4. Comparator Insensitive to Gate Leakage Current

Figure 5:
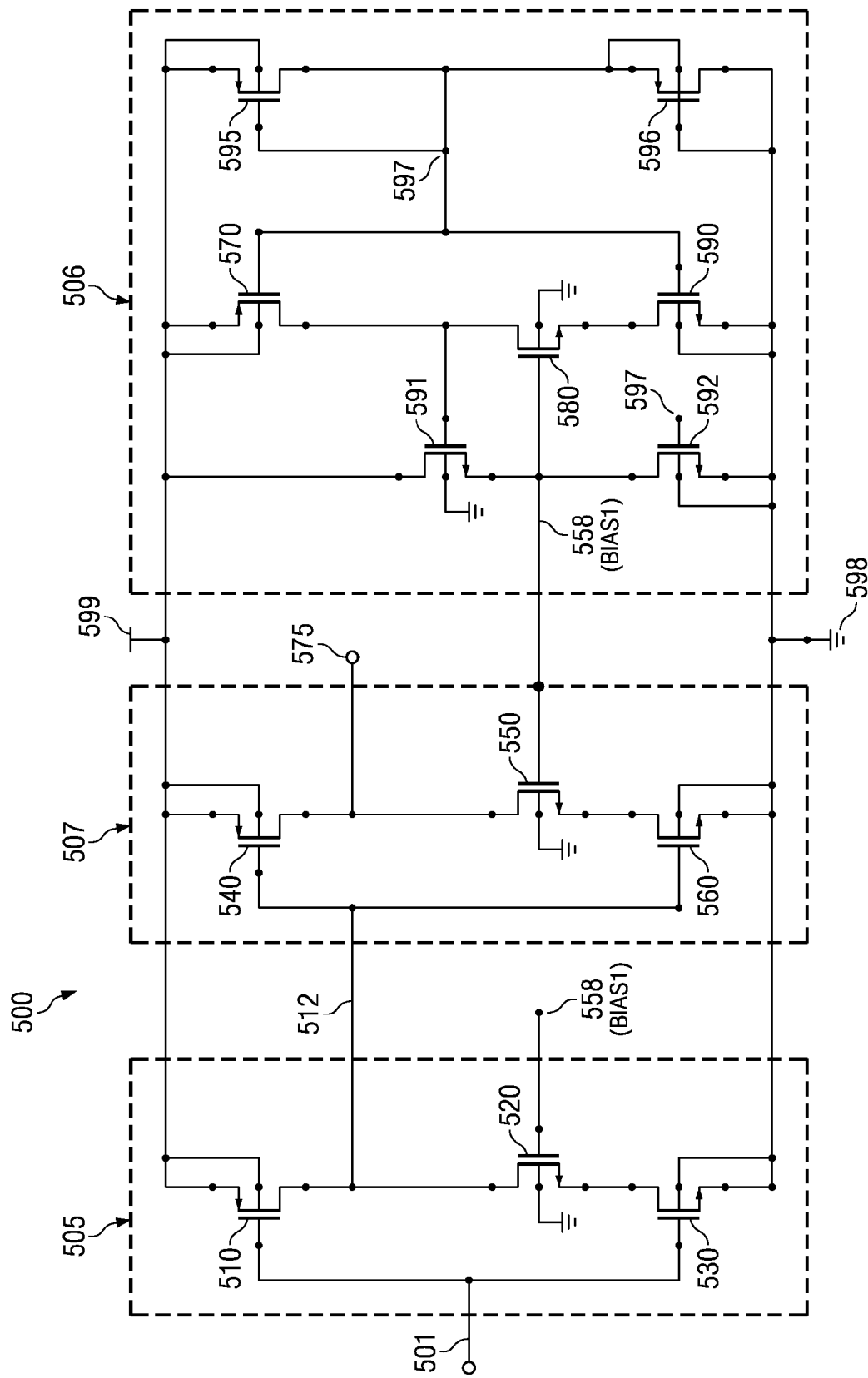
FIG. 5 is a diagram illustrating the implementation details of a comparator with compensation for gate leakage current, in an embodiment of the present invention.

FIG. 5 is a circuit diagram of a comparator in another embodiment of the present invention. Comparator component 500 is shown containing comparison circuit (505), bias generator (506), and inverter block 507. Comparison circuit 505 (containing transistors 510, 520 and 530), and inverter block 507 (containing transistors 540, 550 and 560) have similar structures, and operate similar to comparison circuit 205 and inverter block 207 of FIG. 2 (as well as the corresponding portions of FIG. 3). Terminals 599 and 598 respectively represent power supply and ground terminals.

Bias generator block 506 is shown containing transistors 595, 596, 570, 580, 590, 591 and 592. The operation and structure of bias generator 506 is similar to that of bias generation block 206 of FIG. 2 (node 597 generates a voltage equal to half the power supply voltage 599), except for the following differences. In FIG. 2, transistor 280 whose drain provides bias voltage 258 (BIAS), has its gate terminal connected to its drain terminal.

In contrast, in bias generator 506, the drain terminal of (the corresponding) transistor 580 is connected as an input to a source follower structure formed by transistors 591 and 592. The output of the source follower is provided as the bias (BIAS1 558) to the corresponding (bias receiving) transistors (520 and 550 in FIG. 5). The gain of a source follower being equal to (approximately) one, the bias condition provided to comparison circuit 505 and inverter block 507 is unaltered (bias voltage 558 is the same as the corresponding bias voltage 258 of FIG. 2). With respect to the embodiment of FIG. 5, the current mirror configuration may be viewed as being effected by the following path:

drain terminal of transistor 580—gate of transistor 591—node 558—gate of transistor 580.

However, any leakage current consumed by transistors 520 and 550 (as well as corresponding transistors of other comparison circuits and inverter blocks that may receive BIAS1 558, is now provided by the source follower. As a result, changes in bias voltage 558 due to gate leakage in transistors receiving bias voltage 558 are prevented. It is noted that bias generator 304 (FIG. 3), which enables provision of hysteresis, can also be implemented with a source follower structure at node 357, in a manner similar to that described above.

Thus, several features of the present invention provide a comparator with reduced power consumption, faster switching speeds, as well as with a switching threshold(s) that are controllable over a wide range of process and temperature variations. Comparators implemented as described above may be used in an IC (such as IC 100 of FIG. 1) to implement input/output (I/O) buffers, frequency slicers, pulse width modulation (PWM) circuits, data line sensors, etc.

It may be appreciated that the circuit topologies of FIGS. 2, 3 and 5 are merely representative. Various modifications, as suited for the specific environment, without departing from the scope and spirit of several aspects of the present invention, will be apparent to one skilled in the relevant arts by reading the disclosure provided herein. Similarly, specific transistor types (NMOS, PMOS etc.) noted above are merely by way of illustration.

However, alternative embodiments using different configurations and transistors will be apparent to one skilled in the relevant arts by reading the disclosure provided herein. For example, the NMOS transistors may be replaced with PMOS transistors (and vice versa), while also interchanging the connections to power and ground terminals.

Accordingly, in the instant application, the power and ground terminals are referred to as reference potentials, the source and drain terminals of transistors (through which a current path is provided when turned on and an open path is provided when turned off) are termed as current terminals, and the gate terminal is termed as a control terminal.

Furthermore, though various terminals in circuits described above are shown with direct connections to various other terminals, it should be appreciated that additional components (as suited for the specific environment) may also be present in the path, and accordingly the connections may be viewed as being electrically coupled to the same connected terminals.

While various embodiments of the present invention have been described above, it should be understood that they have been presented by way of example only, and not limitation. Thus, the breadth and scope of the present invention should not be limited by any of the above-described embodiments, but should be defined only in accordance with the following claims and their equivalents.

What is claimed is:

1. An apparatus comprising:
   a first stage having that receives an input signal and that generates a first output signal, wherein the first output signal is at a first logic level if the input signal is greater than a threshold, and wherein the first output signal is at a second logic level if the input signal is less than the threshold, and wherein first stage includes a first transistors that receives a bias signal at its control electrode;
   a second stage that is coupled to receive the first output signal from the first stage and that generates a second output signal, wherein the second output signal is at the second logic level if the first output signal is at the first logic level, and wherein the second output signal is at the first logic level if the first output signal is at the second logic level, and wherein the second stage includes a second transistors that receives the bias signal at its control electrode; and
   a bias generator circuit that generates the bias signal, wherein the bias generator circuit includes a third transistor that is coupled to the control electrodes of the first and second transistors at its control electrode.

2. The apparatus of claim 1, wherein the first stage further comprises:
   a fourth transistor that receives the input signal at its control electrode and that is coupled to the second stage; and
   a fifth transistor that receives the input signal at its control electrode, wherein the first transistor is coupled between the fourth and fifth transistors.

3. The apparatus of claim 2, wherein the second stage further comprises:
   a sixth transistor that that is coupled to the first stage at its control electrode;
   a seventh transistor that that is coupled to the first stage at its control electrode, wherein the second transistor is coupled between the sixth and seventh transistors.

4. The apparatus of claim 3, wherein the third transistor is diode-connected.

5. The apparatus of claim 4, wherein the bias generator circuit further comprises:
   a current mirror that is coupled to the third transistor;
   an eight transistor that is coupled to the current mirror, wherein the eighth transistor is diode-connected; and
   a ninth transistor that is coupled to the third transistor and the current mirror.

6. The apparatus of claim 4, wherein the bias current generator circuit further comprises:
   a voltage divider that generates a first voltage and a second voltage;
   a first pair of transistors that are coupled to the voltage divider to receive the first voltage;
   an eighth transistor that is coupled between the first pair of transistors, wherein the eighth transistor is diode-connected;

a second pair of transistor that are coupled to the voltage divider to receive the second voltage, wherein the third transistor is coupled between the second pair of transistors; and a intermediate circuit that is coupled between third transistor and the first and second transistors.

7. The apparatus of claim 3, wherein the bias generator circuit further comprises a buffer that is coupled between the third transistor and the first and second transistors.

8. An apparatus comprising:
a comparison circuit that generates a first output signal, wherein the first output signal is at a first logic level if an input signal is greater than a threshold, and wherein the first output signal is at a second logic level if the input signal is less than the threshold having:
  a first PMOS transistor that receives an input signal at its gate and that outputs a first output signal at its drain;
  a first NMOS transistor that it is coupled to the drain of the first PMOS transistor at its drain;
an inverter that is coupled to the drain of the first PMOS transistor, wherein the inverter generates a second output signal that is an inversion of the first output signal; and
a bias generator circuit having:
  a second PMOS transistor that is about the same size as the first PMOS transistor; and
  a second NMOS transistor that is coupled to the drain of the second PMOS transistor at its drain and that is coupled to the gate of the second NMOS transistor and the inverter at its gate, wherein the second NMOS transistor is about the same size as the first NMOS transistor.

9. The apparatus of claim 8, wherein the comparison circuit further comprises a third NMOS transistor that is coupled to the source of the first NMOS transistor at its drain and that receives the input signal at its gate, and wherein the bias generator circuit further comprises a fourth NMOS transistor that is coupled to the source of the second NMOS transistor at its drain and the gate of the second PMOS transistor at its gate.

10. The apparatus of claim 9, wherein the second NMOS transistor is diode-connected.

11. The apparatus of claim 10, wherein the bias generator circuit further comprises:
  a third PMOS transistor that is coupled to the gate of the second PMOS transistor at its gate, wherein the third PMOS transistor is diode-connected; and
  a fourth PMOS transistor that is coupled to the drain of the third PMOS transistor at its source, wherein the fourth PMOS transistor is diode-connected.

12. The apparatus of claim 10, wherein the bias generator circuit further comprises a voltage divider that is coupled to the gates of the second PMOS transistor and the fourth NMOS transistors.

13. The apparatus of claim 9, wherein bias generator circuit further comprises a buffer that is coupled between the gates of the first and second NMOS transistors.

\* \* \* \* \*